(12) United States Patent
Ikeda et al.

(10) Patent No.: US 10,824,782 B2
(45) Date of Patent: Nov. 3, 2020

(54) INFORMATION PROCESSING DEVICE, RECORDING MEDIUM RECORDING PRODUCTION PLAN GENERATION PROGRAM, AND PRODUCTION PLAN GENERATION METHOD

(71) Applicant: FUJITSU LIMITED, Kawasaki-shi, Kanagawa (JP)

(72) Inventors: Hiroshi Ikeda, Kawasaki (JP); Masakazu Ishizuka, Oyama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/579,926

(22) Filed: Sep. 24, 2019

(65) Prior Publication Data

US 2020/0019655 A1 Jan. 16, 2020

Related U.S. Application Data

(63) Continuation of application No. PCT/JP2017/016614, filed on Apr. 26, 2017.

(51) Int. Cl.
*G06F 30/00* (2020.01)
*G06F 30/327* (2020.01)
(Continued)

(52) U.S. Cl.
CPC ......... *G06F 30/327* (2020.01); *G06Q 10/043* (2013.01); *G06Q 50/04* (2013.01); *H05K 3/303* (2013.01); *H05K 13/085* (2018.08)

(58) Field of Classification Search
CPC ...... G06F 30/327; G06Q 10/043; H05K 3/30; H05K 13/085
(Continued)

(56) References Cited

U.S. PATENT DOCUMENTS

2003/0116339 A1* 6/2003 Suhara .................. H05K 13/02
174/535
2004/0073322 A1* 4/2004 Maenishi ........... H05K 13/0853
700/28
(Continued)

FOREIGN PATENT DOCUMENTS

DE 102014222936 A1 5/2016
EP 2469585 A2 6/2012
(Continued)

OTHER PUBLICATIONS

International Search Report and Written Opinion of the International Searching Authority (Form PCT/ISA/210 and 237), mailed in connection with PCT/JP2017/016614 and dated May 30, 2017 (6 pages).

(Continued)

*Primary Examiner* — Suchin Parihar
(74) *Attorney, Agent, or Firm* — Fujitsu Patent Center

(57) ABSTRACT

An information processing device includes: a memory; and a processor coupled to the memory and configured to: acquire information on production of substrates and equipment information on a mounting line in which a component is mounted on the substrates; and optimize, based on the information on the production of the substrates and the equipment information on the mounting line, a plurality of factors that affect a time to complete the production of the substrates.

12 Claims, 19 Drawing Sheets

(51) Int. Cl.
*H05K 13/08* (2006.01)
*G06Q 10/04* (2012.01)
*G06Q 50/04* (2012.01)
*H05K 3/30* (2006.01)

(58) Field of Classification Search
USPC .......................................................... 716/104
See application file for complete search history.

(56) References Cited

U.S. PATENT DOCUMENTS

| | | | |
|---|---|---|---|
| 2004/0135099 A1* | 7/2004 | Simon | B82Y 30/00 250/491.1 |
| 2006/0012766 A1* | 1/2006 | Klosner | G03F 7/70291 355/67 |
| 2015/0163903 A1* | 6/2015 | Wada | H05K 3/321 361/760 |
| 2015/0195965 A1 | 7/2015 | Craiovan et al. | |
| 2016/0381844 A1* | 12/2016 | Knox | H05K 13/0408 29/739 |
| 2017/0318716 A1 | 11/2017 | Pfaffinger et al. | |
| 2020/0163220 A1* | 5/2020 | Knox | G01R 31/2805 |

FOREIGN PATENT DOCUMENTS

| | | |
|---|---|---|
| EP | 3451811 A1 | 3/2019 |
| JP | H10-207861 A | 8/1998 |
| JP | 2000-141174 A | 5/2000 |
| JP | 2002-171097 A | 6/2002 |
| JP | 2004-157922 A | 6/2004 |
| JP | 2010-537328 A | 12/2010 |
| JP | 2012-134303 A | 7/2012 |
| JP | 2013-122733 A | 6/2013 |
| JP | 2013-191677 A | 9/2013 |
| JP | 2015-090532 A | 5/2015 |
| JP | 2015-531160 A | 10/2015 |

OTHER PUBLICATIONS

Salonen, Kari, "Setup Optimization in High-Mix Surface Mount PCB Assembly", pp. 1-42, Oct. 1, 2008, XP055200719.
Logendran, Rasaratnam et al., "Minimizing the mean flow time in a two-machine group-scheduling problem with carryover sequence dependency", Robotics and Computer Integrated Manufacturing, Elsevier Science Publishers BV., Barking, GB, vol. 19, No. 1-2, pp. 21-33, Feb. 1, 2003, XP004410194.
Crama, Yves et al., "Production planning problems in printed circuit board assembly", Discrete Applied Mathematics, Elsevier, Amsterdam, NL, vol. 123, No. 1-3, pp. 339-361, Nov. 15, 2002, XP027296744.
Extended European Search Report dated Mar. 23, 2020 for corresponding European Patent Application No. 17907291.3, 11 pages.
Japanese Office Action dated Jun. 30, 2020 for corresponding Japanese Patent Application No. 2019-514965, with English Translation, 5 pages.

* cited by examiner

FIG. 6

| SUBSTRATE | NUMBER OF SHEETS | SUBSTRATE WIDTH |
|---|---|---|
| SUBSTRATE A | 50 | 330 |
| SUBSTRATE B | 100 | 230 |
| SUBSTRATE C | 20 | 230 |
| SUBSTRATE D | 40 | 230 |
| SUBSTRATE E | 150 | 330 |
| SUBSTRATE F | 300 | 330 |
| ⋮ | ⋮ | ⋮ |

FIG. 7A

| SUBSTRATE | COMPONENT | MOUNTED NUMBER OF COMPONENT PER SHEET |
|---|---|---|
| SUBSTRATE A | COMPONENT 1 | 1 |
| SUBSTRATE A | COMPONENT 2 | 5 |
| SUBSTRATE A | COMPONENT 3 | 20 |
| SUBSTRATE A | COMPONENT 4 | 400 |
| SUBSTRATE B | COMPONENT 2 | 3 |
| SUBSTRATE B | COMPONENT 5 | 6 |
| SUBSTRATE B | COMPONENT 6 | 10 |
| ⋮ | ⋮ | ⋮ |

FIG. 7B

| MOUNTER | CARRIAGE POSITION | NUMBER OF CHANNELS IN CARRIAGE | FIXED/SETUP |
|---|---|---|---|
| MOUNTER 1 | CARRIAGE POSITION 1 | 50 | SETUP CARRIAGE |
| MOUNTER 2 | CARRIAGE POSITION 2_1 | 30 | SETUP CARRIAGE |
| MOUNTER 2 | CARRIAGE POSITION 2_2 | 30 | SETUP CARRIAGE |
| MOUNTER 3 | CARRIAGE POSITION 3_1 | 50 | FIXED CARRIAGE |
| MOUNTER 3 | CARRIAGE POSITION 3_2 | 30 | FIXED CARRIAGE |
| MOUNTER 4 | CARRIAGE POSITION 4 | 60 | SETUP CARRIAGE |
| MOUNTER 5 | CARRIAGE POSITION 5 | 100 | SETUP CARRIAGE |
| ⋮ | ⋮ | ⋮ | ⋮ |

FIG. 8A

| CARRIAGE POSITION | COMPONENT | MOUNTING TIME PER COMPONENT | NUMBER OF CHANNELS USED BY COMPONENT | OFF-LINE SETUP TIME FOR COMPONENT |
|---|---|---|---|---|
| POSITION 1 | COMPONENT 1 | 0.2 | 1 | 90 |
| POSITION 1 | COMPONENT 2 | 0.3 | 2 | 50 |
| POSITION 1 | COMPONENT 3 | 0.2 | 5 | 70 |
| POSITION 1 | COMPONENT 4 | NOT MOUNTABLE | 4 | UNAVAILABLE |
| POSITION 2_1 | COMPONENT 1 | 0.2 | 2 | 90 |
| POSITION 2_1 | COMPONENT 2 | 0.3 | 3 | 50 |
| POSITION 2_1 | COMPONENT 3 | 0.2 | 5 | 70 |
| POSITION 2_1 | COMPONENT 4 | 0.4 | 5 | 100 |
| POSITION 3_1 | COMPONENT 1 | 0.2 | FIXED CARRIAGE | FIXED CARRIAGE |
| POSITION 3_1 | COMPONENT 2 | 0.2 | FIXED CARRIAGE | FIXED CARRIAGE |
| ... | ... | ... | ... | ... |

FIG. 8B

| CARRIAGE POSITION | LEFT COMPONENT | RIGHT COMPONENT | |
|---|---|---|---|
| POSITION 1 | COMPONENT 1 | COMPONENT 2 | 2 |
| POSITION 1 | COMPONENT 2 | COMPONENT 3 | 3 |
| POSITION 1 | - | COMPONENT 1 | 1 |
| POSITION 1 | - | COMPONENT 2 | 2 |
| POSITION 2_1 | COMPONENT 4 | COMPONENT 6 | 5 |
| POSITION 2_1 | COMPONENT 5 | COMPONENT 4 | 3 |
| ... | ... | ... | ... |

FIG. 9A

| SUBSTRATE GROUP | SUBSTRATE |
|---|---|
| GROUP A | SUBSTRATE A |
| GROUP A | SUBSTRATE D |
| GROUP A | SUBSTRATE F |
| GROUP B | SUBSTRATE C |
| GROUP B | SUBSTRATE E |
| ... | ... |

FIG. 9B

| SUBSTRATE | COMPONENT | MOUNTER | CARRIAGE POSITION | NUMBER OF COMPONENTS MOUNTED |
|---|---|---|---|---|
| SUBSTRATE A | COMPONENT 1 | MOUNTER 1 | POSITION 1 | 1 |
| SUBSTRATE A | COMPONENT 2 | MOUNTER 2 | POSITION 2 | 5 |
| SUBSTRATE A | COMPONENT 3 | MOUNTER 3 | POSITION 3_1 | 10 |
| SUBSTRATE A | COMPONENT 3 | MOUNTER 4 | POSITION 4 | 10 |
| SUBSTRATE A | COMPONENT 4 | MOUNTER 2 | POSITION 2 | 100 |
| SUBSTRATE A | COMPONENT 4 | MOUNTER 5 | POSITION 5 | 200 |
| SUBSTRATE A | COMPONENT 4 | MOUNTER 6 | POSITION 6 | 100 |
| ... | ... | ... | ... | ... |

FIG. 10A

| SUBSTRATE GROUP | MOUNTER | CARRIAGE POSITION | CHANNEL POSITION | COMPONENT |
|---|---|---|---|---|
| GROUP A | MOUNTER 1 | POSITION 1 | 1 | COMPONENT 4 |
| GROUP A | MOUNTER 1 | POSITION 1 | 3 | COMPONENT 2 |
| GROUP A | MOUNTER 2 | POSITION 2_1 | 1 | COMPONENT 6 |
| GROUP A | MOUNTER 2 | POSITION 2_1 | 2 | COMPONENT 3 |
| GROUP B | MOUNTER 1 | POSITION 1 | 1 | COMPONENT 3 |
| GROUP B | MOUNTER 1 | POSITION 1 | 3 | COMPONENT 5 |
| GROUP B | MOUNTER 2 | POSITION 2_1 | 1 | COMPONENT 2 |
| GROUP B | MOUNTER 2 | POSITION 2_1 | 2 | COMPONENT 4 |
| ... | ... | ... | ... | ... |

FIG. 10B

| MANUFACTURING ORDER | GROUP |
|---|---|
| 1 | GROUP A |
| 2 | GROUP C |
| 3 | GROUP B |
| ... | ... |

FIG. 16A

| SUBSTRATE GROUP | SUBSTRATE | SUBSTRATE WIDTH | MOUNTING TIME |
|---|---|---|---|
| B | SUBSTRATE A | 330 | 50 |
| B | SUBSTRATE B | 230 | 80 |
| B | SUBSTRATE C | 230 | 50 |
| A | SUBSTRATE D | 230 | 100 |
| A | SUBSTRATE E | 330 | 70 |
| A | SUBSTRATE F | 230 | 20 |
| C | SUBSTRATE G | 330 | 50 |
| C | SUBSTRATE H | 230 | 90 |
| C | SUBSTRATE I | 230 | 40 |

FIG. 16B

| SUBSTRATE GROUP | SUBSTRATE | SUBSTRATE WIDTH | MOUNTING TIME |
|---|---|---|---|
| B | SUBSTRATE B | 330 | 80 |
| B | SUBSTRATE C | 230 | 50 |
| B | SUBSTRATE A | 230 | 50 |
| A | SUBSTRATE E | 330 | 70 |
| A | SUBSTRATE F | 230 | 20 |
| A | SUBSTRATE D | 230 | 100 |
| C | SUBSTRATE H | 230 | 90 |
| C | SUBSTRATE I | 230 | 40 |
| C | SUBSTRATE G | 330 | 50 |

FIG. 16C

| SUBSTRATE GROUP | SUBSTRATE | SUBSTRATE WIDTH | MOUNTING TIME |
|---|---|---|---|
| B | SUBSTRATE C | 230 | 50 |
| B | SUBSTRATE B | 230 | 80 |
| B | SUBSTRATE A | 330 | 50 |
| A | SUBSTRATE E | 330 | 70 |
| A | SUBSTRATE F | 230 | 20 |
| A | SUBSTRATE D | 230 | 100 |
| C | SUBSTRATE I | 230 | 40 |
| C | SUBSTRATE H | 230 | 90 |
| C | SUBSTRATE G | 330 | 50 |

INFORMATION PROCESSING DEVICE, RECORDING MEDIUM RECORDING PRODUCTION PLAN GENERATION PROGRAM, AND PRODUCTION PLAN GENERATION METHOD

CROSS-REFERENCE TO RELATED APPLICATION

This application is a continuation application of International Application PCT/JP2017/016614 filed on Apr. 26, 2017 and designated the U.S., the entire contents of which are incorporated herein by reference.

FIELD

The embodiment relates to an information processing device, a production plan generation program, and a production plan generation method.

BACKGROUND

In order to respond flexibly to changes in the market in recent years and diversification of customer needs, manufacturing by high-mix low-volume production has been performed. High-mix low-volume production is also performed in production lines (surface mounting technology ((SMT) lines) for mounting components on substrates.

Related art is disclosed in Japanese Laid-open Patent Publication No. 2013-191677.

SUMMARY

According to an aspect of the embodiments, an information processing device includes: a memory; and a processor coupled to the memory and configured to: acquire information on production of substrates and equipment information on a mounting line in which a component is mounted on the substrates; and optimize, based on the information on the production of the substrates and the equipment information on the mounting line, a plurality of factors that affect a time to complete the production of the substrates.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram illustrating a data structure of a substrate quantity information DB.

FIG. 7A is a diagram illustrating a data structure of a mount component information table of a production information DB, and FIG. 7B is a diagram illustrating a data structure of a mounter information table of the production information DB.

FIG. 8A is a diagram illustrating a data structure of a carriage position information table of the production information DB, and FIG. 8B is a diagram illustrating a data structure of a used channel number table of the production information DB.

FIG. 9A is a diagram illustrating a data structure of a substrate group table of a production plan information DB, and FIG. 9B is a diagram illustrating a data structure of a component allocation table of the production plan information DB.

FIG. 10A is a diagram illustrating a data structure of an off-line setup plan table of the production plan information DB, and FIG. 10B is a diagram illustrating a data structure of a substrate group manufacturing order table of the production plan information DB.

FIGS. 16A to 16C are diagrams for describing the result of processing of FIG. 14.

DESCRIPTION OF EMBODIMENTS

For example, with regard to substrate production, production efficiency may be improved, work time may be shorten, and setup work load may be reduced.

When a production plan in the SMT line is made, it is necessary to minimize the production time by optimizing the factors that affect the time required from the start to end of production. In order to do this, it is necessary to solve a combinatorial optimization problem of variables related to the substrate to be manufactured and the SMT line.

However, the factors that affect the required time are related to each other, and there are also trade-off relationships between some factors. For example, there is a trade-off relationship between the mounting time of a component on a substrate and the time (off-line setup time) of preparing a carriage containing the component (carriage that can be replaced with mounter in SMT line).

Accordingly, since the number of combinations of the factors is huge in a case of determining the factors that affect the required time, it is necessary to take countermeasures for combinational explosion.

In one aspect, a production plan generation device, a production plan generation program, and a production plan generation method capable of reducing processing load when a production plan of a production line is generated may be provided.

Hereinafter, an embodiment of a production system will be described in detail on the basis of FIGS. 1 to 17.

Figure 1:
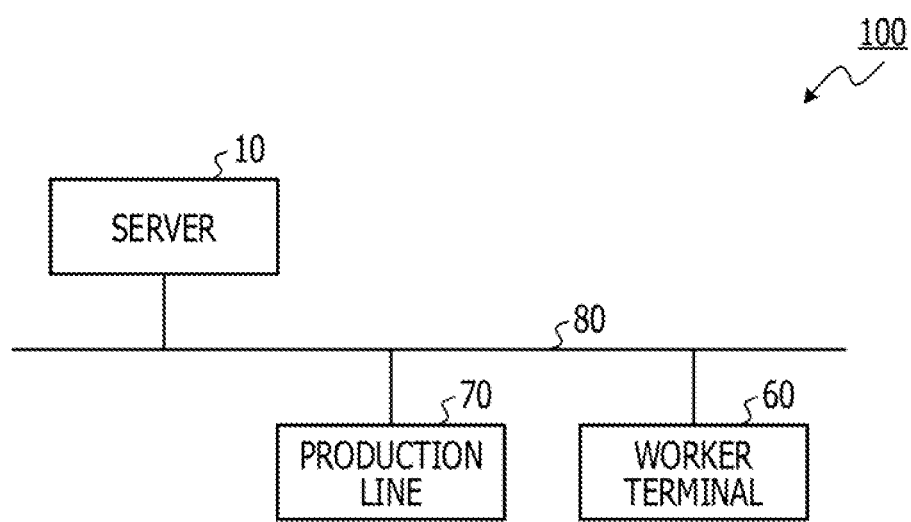
FIG. 1 is a view schematically illustrating a configuration of a production system of an embodiment.

FIG. 1 schematically illustrates a configuration of a production system 100 of an embodiment. As illustrated in FIG. 1, the production system 100 of the embodiment includes a production line 70, a server 10 as a production plan generation device, and a worker terminal 60. The production line 70, the server 10, and the worker terminal 60 are connected to a network 80.

Figure 2:
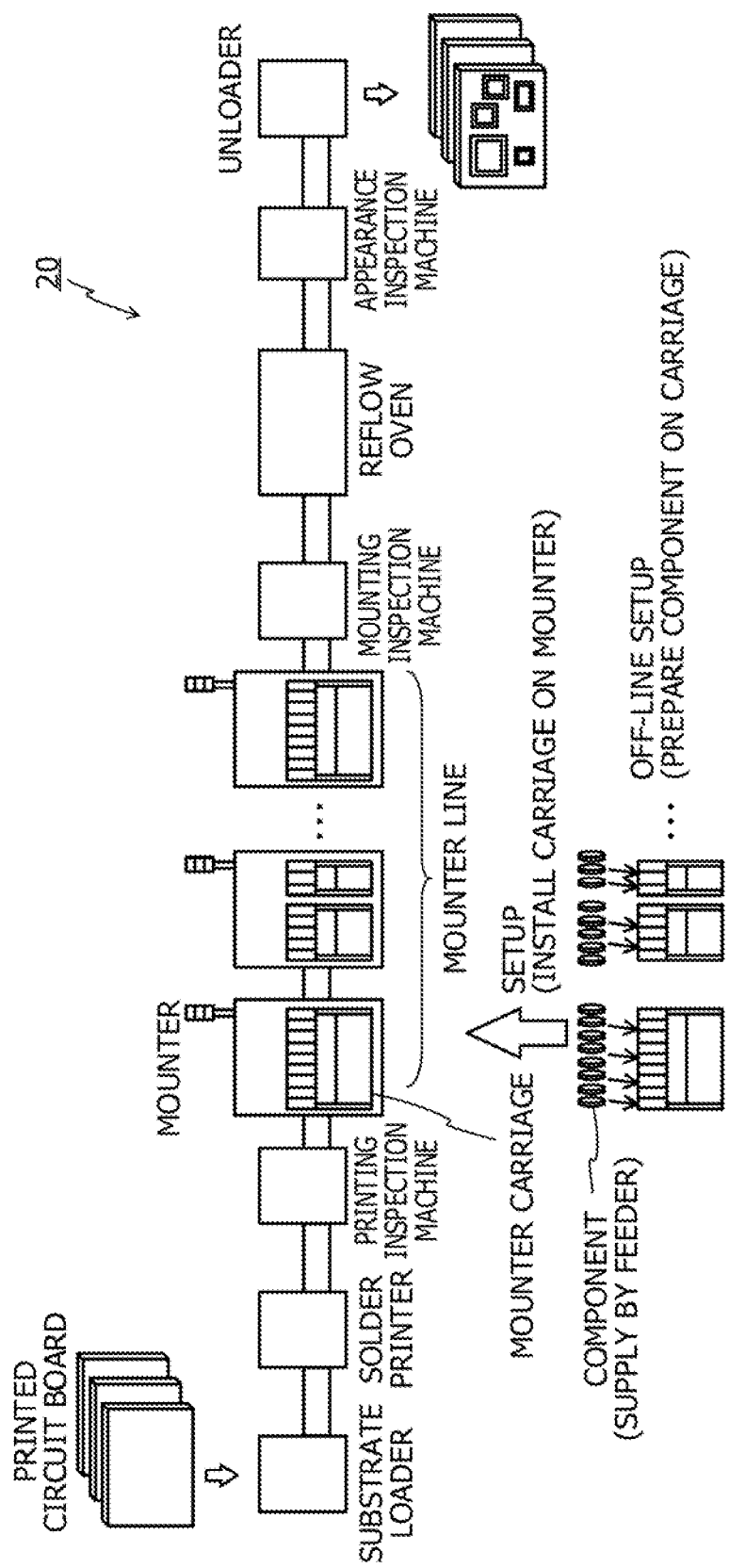
FIG. 2 is a diagram illustrating a surface mounting line of a production line.

The production line 70 has a surface mounting line 20 as illustrated in FIG. 2 as an example. The surface mounting line 20 is a line (SMT line) for mounting a component on a printed circuit board (hereinafter simply referred to as "substrate"), and includes a substrate loader, a solder printer, a printing inspection machine, a mounter line, a mounting inspection machine, a reflow oven, an appearance inspection machine, an unloader, and the like. The devices are connected by a conveyor. The surface mounting line 20 has multiple mounters for mounting components on a substrate.

The substrate loader loads the substrates onto the conveyor. The solder printer prints solder at predetermined locations on a substrate. The printing inspection machine inspects the solder on the substrate. A board that passes the inspection by the printing inspection machine is transported to the mounter line, and in the mounter line, surface mount components such as electronic parts (hereinafter simply referred to as "components") are surface-mounted on the printed solder on the substrate on each mounter. The mounting inspection machine inspects whether there is a defect in the mounting of the component on the substrate. The reflow oven fixes the component to the substrate by reflowing the substrate that passes the inspection. The appearance inspection machine inspects the appearance of the substrate for defects. The unloader takes out the substrate that passes the inspection from the conveyor.

Note that in each surface mounting line 20 (SMT line), substrates are processed in order determined in advance in a production plan.

Here, the surface mounting line 20 has the following equipment constraints.

(1) Types of components to be mounted on a substrate are prepared on a mounter carriage (surface mount component supply carriage) using a component feeder (feeder), and the mounter carriage is installed on a mounter to mount the components on the substrate. Note that the work of preparing components on the mounter carriage is referred to as "off-line setup".

(2) When the type of component mounted on the substrate is replaced using the mounter, the replacement is done on a carriage basis. Note that as in the case of the second mounter from the left in FIG. 2, multiple carriages may be installed on one mounter.

Figure 3:
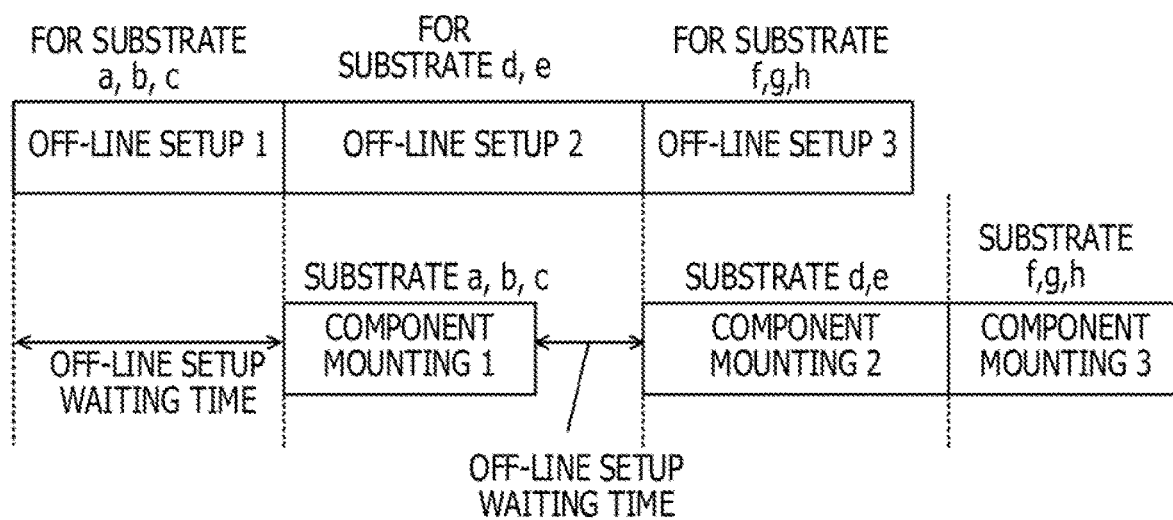
FIG. 3 is a diagram for describing a component mounting time, an off-line setup time, and an off-line setup waiting time.

(3) All types of components to be mounted on the same substrate need to be arranged on any one of the carriages in the mounter line. That is, while manufacturing the same substrate, it is not possible to exchange the carriages in any of the mounters. In addition, unless off-line setup is completed before the start of manufacturing of a substrate, the manufacturing of the substrate cannot be started. Such time of delaying the start of manufacturing of a substrate until completion of off-line setup is hereinafter referred to as "off-line setup waiting time". For example, as illustrated in FIG. 3, since components cannot be mounted on substrates a, b, and c until completion of off-line setup for the substrates a, b, and c, an off-line setup waiting time occurs. In addition, while mounting the components on the substrates a, b, and c, it is possible to perform off-line setup for the next substrates d and e in parallel. However, after completion of mounting of the components on the substrates a, b, and c, components cannot be mounted on the substrates d and e since there is an off-line setup waiting time until completion of the off-line setup for the substrates d and e. Note that the groups of substrates a, b, and c, substrates d and e, and substrates f, g, and h in FIG. 3 are groups of substrates which can be manufactured continuously without changing the components set in the mounters, and are "substrate groups".

(4) There is a limit to the types of components (feeders) that can be prepared for one carriage. Note that he feeder is a device for supplying components to the mounter, and one feeder supplies one type of component. Components are supplied to the feeder by reels or the like. When there are no more components in the feeder, a new reel or the like is installed in the feeder.

(5) The carriage's channel usage differs depending on the arrangement order of the feeders. This is because, due to interference caused by the physical shape of the feeder, the minimum gap required between the feeders differs depending on the set of adjacent feeders. Accordingly, the number of feeders that fit in one carriage differs depending on the arrangement order of the feeders.

(6) The off-line setup time is different for each component type.

Recently, high-mix low-volume production has often been performed in surface mounting lines. In the surface mounting line, it is not possible to install all types of components used in manufacturing all the substrates included in the production plan on the surface mounting line at once, and it is necessary to replace the carriages. In this case, by grouping substrates having similar components to be mounted as much as possible and using a common carriage in the substrate group, the total number of carriages to be prepared can be reduced and the off-line setup work time can be shortened. Further, the component mounting time (production time) on the substrate in the surface mounting line differs depending on the allocation of components to be mounted on the substrate (how many of which component to mount on the substrate from which carriage position of which mounter). In addition, changing the manufacturing order of the substrate groups also changes the off-line setup waiting time.

Note that some mounters have a fixed carriage, so that the carriage cannot be changed from the start to completion of production. Accordingly, the components that can be mounted from the mounter are limited to the types of components mounted on the carriage at the start of production. Such a mounter and carriage are referred to as "fixed mounter" and "fixed carriage", whereas a mounter that is not a fixed mounter is referred to as "setup mounter", and a carriage that is not a fixed carriage are referred to as "setup carriage".

Referring back to FIG. 1, the server 10 creates a production plan of the surface mounting line 20 included in the production line 70 on the basis of predetermined substrate quantity information and production information. Further, the server 10 transmits the created production plan to the production line 70 and the worker terminal 60.

Figure 4:
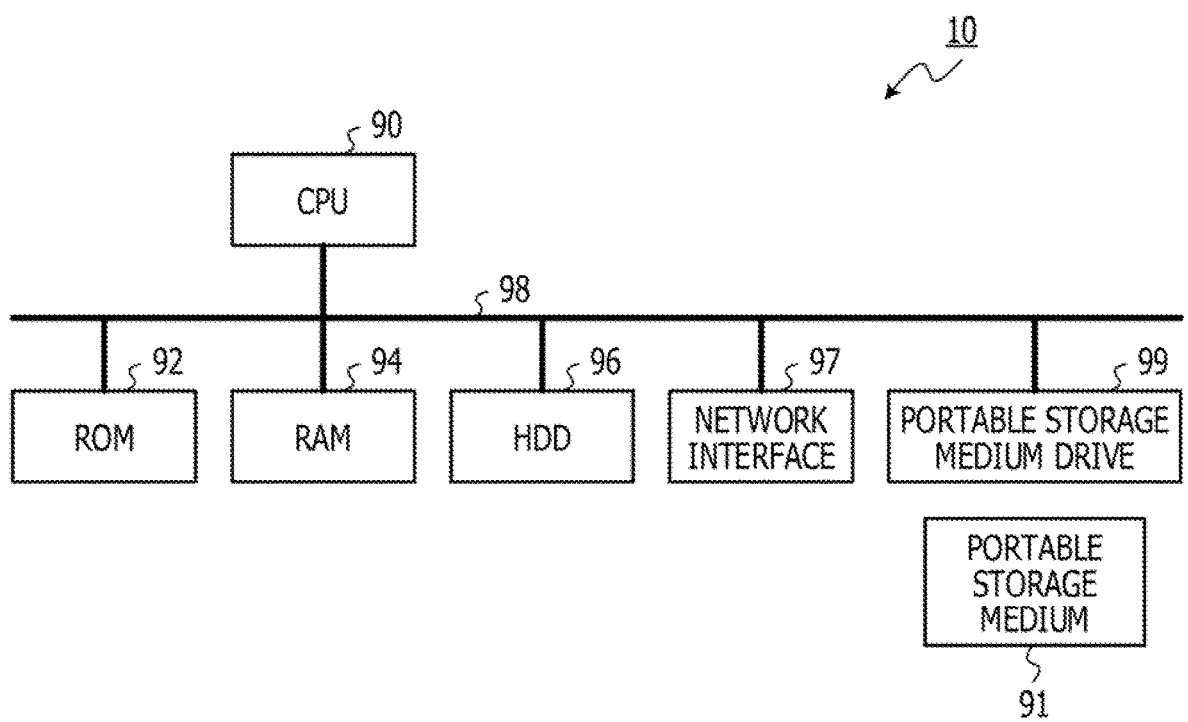
FIG. 4 is a diagram illustrating a hardware configuration of a server.

FIG. 4 illustrates a hardware configuration of the server 10. As illustrated in FIG. 4, the server 10 includes a central processing unit (CPU) 90, a read only memory (ROM) 92, a random access memory (RAM) 94, a storage (hard disk drive (HDD) in this case) 96, a network interface 97, a portable storage medium drive 99, and the like. The components of the server 10 are connected to a bus 98. In the server 10, the CPU 90 executes a program (including production plan generation program) stored in the ROM 92 or the HDD 96 or a program (including production plan generation program) read by the portable storage medium drive 99 from a portable storage medium 91, to implement functions as units illustrated in FIG. 5. Note that not only a CPU but also a micro processing unit (MPU) or the like may execute a program to implement the functions of the units. Furthermore, the functions of the units may be implemented by an integrated circuit such as an application specific integrated circuit (ASIC), a field programmable gate array (FPGA), and the like. Note that FIG. 5 also illustrates a substrate quantity information database (DB) 52 and a production information DB 54 stored in an HDD 96 or the like of the server 10.

Figure 5:
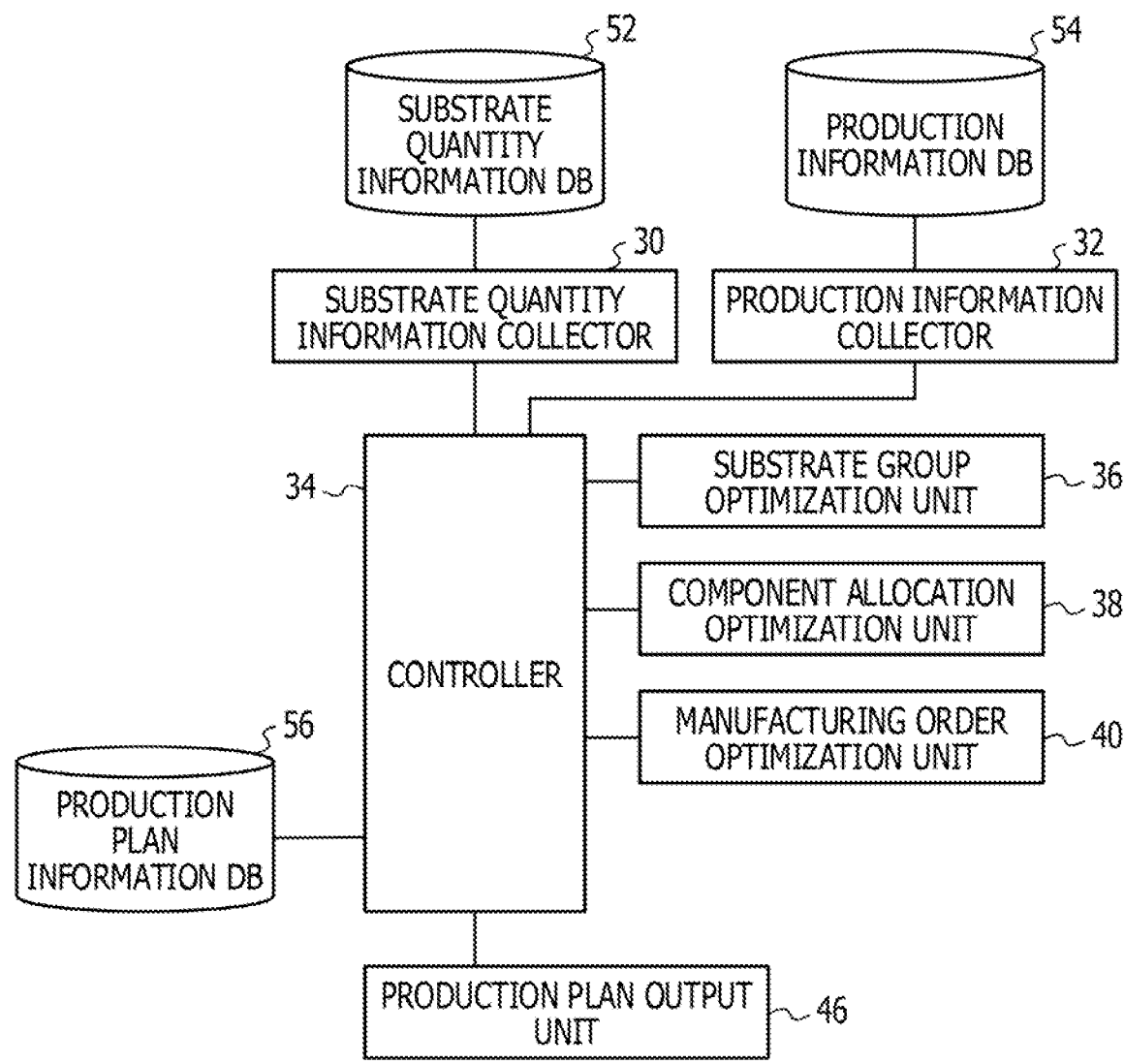
FIG. 5 is a functional block diagram of the server.

FIG. 5 illustrates a functional block diagram of the server 10. The CPU 90 executes a program to function as a substrate quantity information collector 30, a production information collector 32, a controller 34, a substrate group optimization unit 36, a component allocation optimization unit 38, a manufacturing order optimization unit 40, and a production plan output unit 46 illustrated in FIG. 5.

The substrate quantity information collector 30 collects substrate amount information from the substrate quantity information DB 52 and transmits the substrate quantity information to the controller 34. Substrate quantity information includes information on how many of each of the substrates are to be manufactured, information on the width of each substrate, and the like as information on substrate production. FIG. 6 illustrates an example of a data structure of the substrate quantity information DB 52. As illustrated in FIG. 6, the substrate quantity information DB 52 has fields of "substrate", "number of sheets", and "substrate width".

Referring back to FIG. 5, the production information collector 32 collects production information from the production information DB 54 and transmits the production information to the controller 34. The production information DB 54 includes information on substrate production and equipment information on the surface mounting line 20 for mounting components on the substrates. Specifically, the production information DB 54 includes a mount component information table 154A illustrated in FIG. 7A, a mounter information table 154B illustrated in FIG. 7B, a carriage position information table 154C illustrated in FIG. 8A, and a used channel number table 154D illustrated in FIG. 8B.

The mount component information table 154A is a table specifying how many of which components are mounted on each substrate, and as illustrated in FIG. 7A, has fields of "substrate", "component", and "mounted number of component per sheet". In FIG. 7A, there is stored information indicate that one component 1, five components 2, 20 components 3, and 400 components 4 are mounted on one substrate A, for example.

The mounter information table 154B is a table for managing information on the carriages that can be set in each mounter. As illustrated in FIG. 7B, the mounter information table 154B has fields of "mounter", "carriage position", "number of channels in carriage", and "fixed/setup". In FIG. 7B, there is stored information indicate that a setup carriage (carriage position 1) having 50 channels in the carriage can be set in mounter 1, and setup carriages (carriage positions 2_1, 2_2) having 30 channels can be set in mounter 2, for example. Note that the "carriage position" refers to the position where the carriage is set in the mounter. The "fixed/setup" field stores information on whether the carriage is a fixed carriage or a setup carriage.

The carriage position information table 154C is a table for managing information on each of the carriage positions. As illustrated in FIG. 8A, the carriage position information table 154C, has fields of "cart position", "component", "mounting time per component", "number of channels used by component", and "off-line setup time for component". The carriage position information table 154C stores, when each component is prepared at each carriage position, information on the amount of time it takes to mount one component on a substrate or whether the component cannot be mounted, and information on the number of channels in the carriage the component uses and the length of the off-line setup time of the component.

The used channel number table 154D is a table for managing information on how many channels are used when components (feeders) are installed in each position of each carriage. As illustrated in FIG. 8B, the used channel number table 154D has fields of "carriage position", "left component", "right component", and "number of channels used by right component". The used channel number table 154D stores the number of used channels in a case where a component stored in the field of "right component" is prepared in a position stored in the field of "carriage position". The used channel number table 154D indicates that the used number of channels varies depending on the component adjacent to the left side of a component (component stored in field of "left component"). Note that when "–" is stored in the "left component" field, the component stored in the "right component" field is arranged at the left end of a channel portion of a carriage.

Referring back to FIG. 5, the controller 34 has centralized control over the processing of functions (units) of the server 10. For example, the controller 34 transmits data and the like collected by the substrate quantity information collector 30 and the production information collector 32 to each unit 36, 38, 40, 46 at an appropriate timing, or causes each unit to execute processing at an appropriate timing.

The substrate group optimization unit 36, the component allocation optimization unit 38, and the manufacturing order optimization unit 40 execute processing under the instruction of the controller 34, and store the processing result in a production plan information DB 56 through the controller 34. Specifically, the production plan information DB 56 includes a substrate group table 156A of FIG. 9A, a component allocation table 156B of FIG. 9B, an off-line setup plan table 156C of FIG. 10A, and a substrate group manufacturing order table 156D of FIG. 10B. Note that details of each table in FIGS. 9A to 10B will be described later.

The substrate group optimization unit 36 obtains a combination of substrates in which components to be mounted on substrates can be mounted simultaneously on a mounter, and has the largest number of substrates (number of types of substrates), and sets the obtained combination of substrates as a substrate group. The substrate group optimization unit 36 formulates an integer programming problem, and executes optimization processing of the substrate group using an integer programming problem solver such as a GNU linear programming kit (GLPK). Further, the substrate group optimization unit 36 determines, for the substrate group, whether all of the components (feeders) fit in the carriage, as a feeder arrangement optimization problem using the integer programming problem solver. Note that details of the processing of the substrate group optimization unit 36 will be described later. The processing result of the substrate group optimization unit 36 is stored in the substrate group table 156A of FIG. 9A. The substrate group table 156A stores information on which substrate belongs to each substrate group.

The component allocation optimization unit 38 optimizes, for each substrate group, allocation of components to mounters (how many of which component to mount from which mounter) using an integer programming problem solver, so that the total mounting time of the substrate group is minimized. Further, the component allocation optimization unit 38 determines whether all the components (feeders)

fit in the carriage as a result of optimizing the component allocation to the mounter, as a feeder arrangement optimization problem using the integer programming problem solver. Note that details of the processing of the component allocation optimization unit 38 will be described later. The processing result of the component allocation optimization unit 38 is stored in the component allocation table 156B of FIG. 9B and the off-line setup plan table 156C of FIG. 10A. The component allocation table 156B stores information on which carriage position of which mounter each component to be mounted on each substrate is mounted, and how many of each component is mounted on each substrate. The off-line setup plan table 156C stores, for each substrate group, information on which component is stored in which channel position of which carriage of which mounter. Note that the field of "channel position" in FIG. 10A stores the arrangement order counted from the left when the feeders of the components are arranged on the carriage in a packed manner from the left.

The manufacturing order optimization unit 40 optimizes the manufacturing order of substrate groups using the integer programming problem solver so as to minimize the time from the start of manufacturing to completion of manufacturing. Further, after optimizing the manufacturing order of the substrate groups, the manufacturing order optimization unit 40 optimizes the manufacturing order of the substrates in the substrate group using the integer programming problem solver so as to minimize the number of changes in the width of the substrate flowing through the mounter while fixing the manufacturing order of the substrate groups, that is, to minimize the number of switching operations of the width of the lane that the substrate passes through. Furthermore, the manufacturing order optimization unit 40 optimizes the manufacturing order of the substrates in the substrate group using the integer programming problem solver so as to level the number of substrates per unit time output to a process after the surface mounting line 20 while maintaining the number of changes in substrate width. Note that details of the processing of the manufacturing order optimization unit 40 will be described later. The processing result of the manufacturing order optimization unit 40 is stored in the substrate group manufacturing order table 156D of FIG. 10B. The substrate group manufacturing order table 156D of FIG. 10B stores the manufacturing order of each group. Further, the manufacturing order optimization unit 40 rearranges the arrangement order of the substrates in the substrate group table 156A of FIG. 9A in the manufacturing order on the basis of the processing result.

The production plan output unit 46 transmits information (production plan) stored in the production plan information DB 56 to the worker terminal 60 or to the production line 70 under the instruction of the controller 34.

Note that as described above, the production plan includes information such as how many of which components are mounted on which substrate from which mounter, in what order the substrates are manufactured, when to replace the mounter carriage, and which component to prepare (arrange) on the replaced carriage. According to the production plan, the time to mount the components on the substrate, the time to prepare (arrange) the components on the carriage (off-line setup time), and the off-line setup waiting time when off-line setup (preparation on carriage) of components necessary for mounting is not completed change, and production time changes. For this reason, the server 10 creates an appropriate production plan so as to shorten the production time.

Referring back to FIG. 1, the worker terminal 60 is a terminal carried by a worker or installed near the production line 70, and is assumed to be a personal computer (PC), a tablet terminal, a smartphone, or the like. The worker terminal 60 includes a display, and supports the worker's work by displaying the production plan determined by the server 10.

(Production Plan Determination Processing by Server 10)

Hereinafter, production plan determination processing by the server will be described in detail along the flowcharts of FIGS. 11 to 14, with reference to the other drawings.

Figure 11:
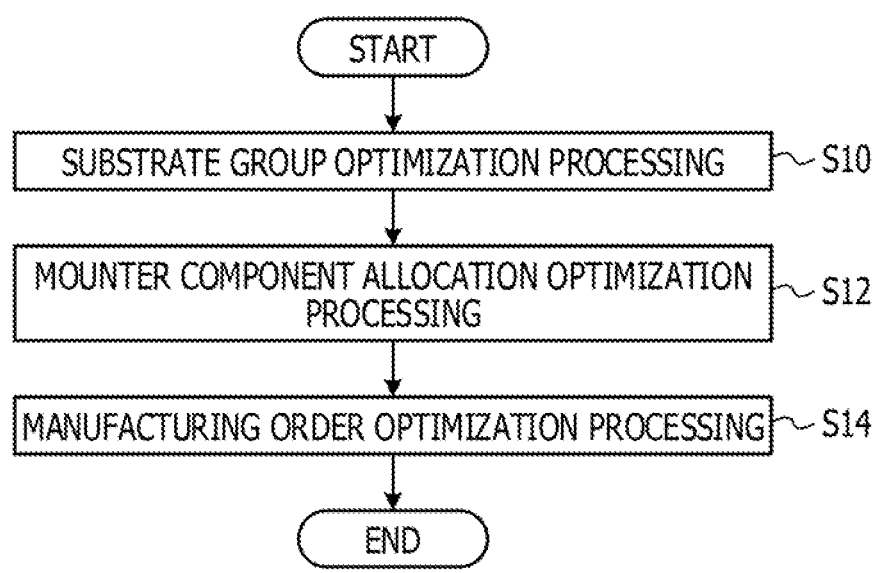
FIG. 11 is a flowchart illustrating processing of a server.

The processing of FIG. 11 is executed at a timing when it is necessary to create a new substrate production plan, which is a timing before the start of a day's operation on the production line 70, for example.

In the processing of FIG. 11, substrate group optimization processing (S10), mounter component allocation optimization processing (S12), and manufacturing order optimization processing (S14) are executed in stages. The details of each processing will be described below.

(Substrate Group Optimization Processing (S10))

Figure 12:
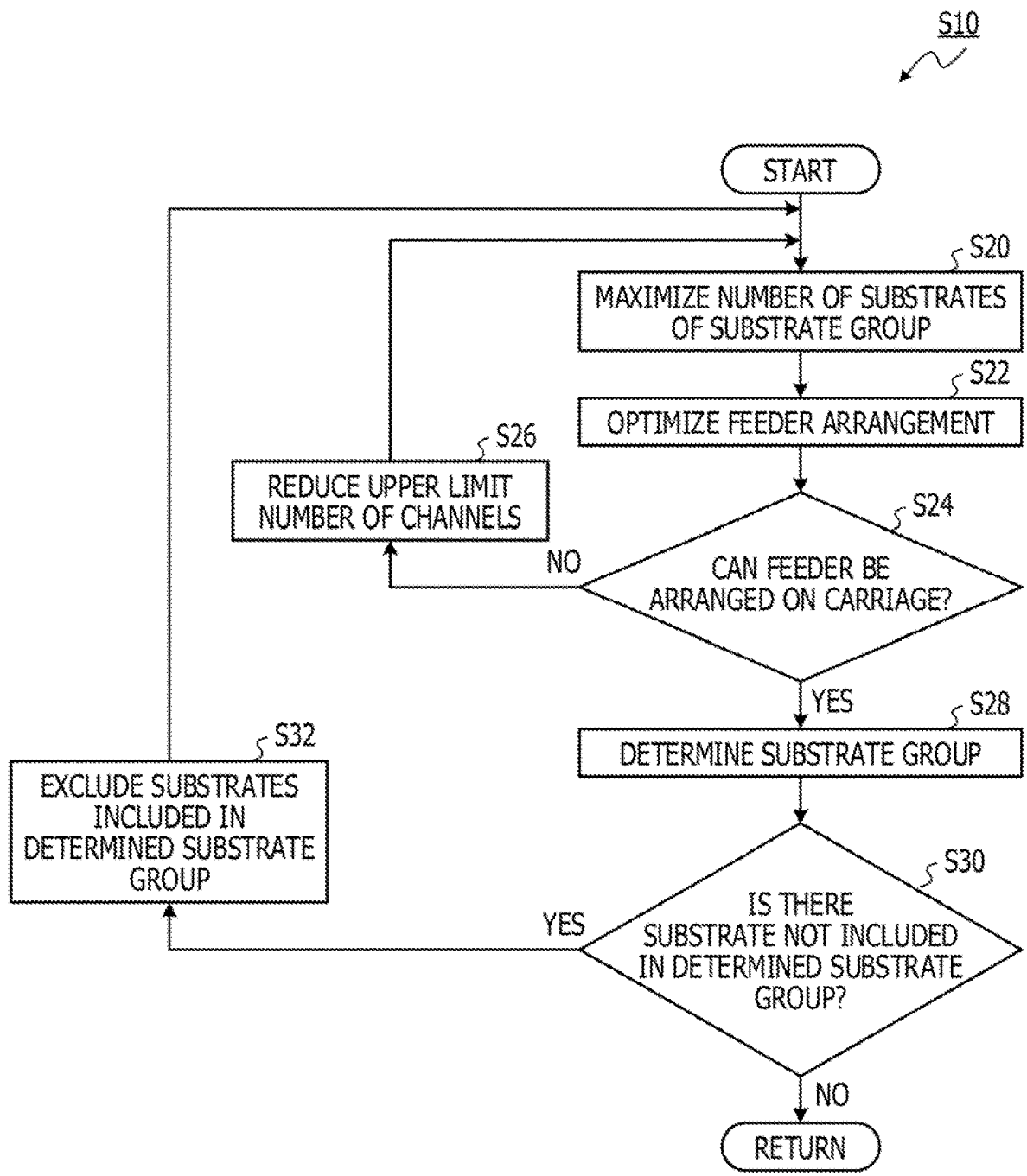
FIG. 12 is a flowchart illustrating details of processing of step S10 in FIG. 11.

The substrate group optimization processing is processing executed by the substrate group optimization unit 36, and more specifically, is processing in accordance with the flowchart of FIG. 12.

In the processing of FIG. 12, first, in step S20, the substrate group optimization unit 36 executes processing of maximizing the number of substrates of the substrate group. The substrate group optimization unit 36 defines input variables, decision variables, an objective function, and constraints as follows, and formulates an integer programming problem.

(Input Variable)

(1) $O_{fp}$: The number of channels used when the feeder of a component p is installed on a carriage f.

(2) $M_f$: The upper limit number of channels of the carriage f.

However, $O_{fp}$ in (1) is a temporary value of the number of channels used when the feeder of the component p is installed on the carriage f (value of field "number of channels used by component" in carriage position information table 154C).

(Decision Variable)

(1) $G_d$: Value 1 is set when a substrate d is placed in the substrate group, and value 0 is set when the substrate d is not placed in the substrate group.

(2) $S_{fp}$: Value 1 is set when the component p is installed on the carriage f, and value 0 is set when the component p is not installed.

(Objective Function (Maximize))

The objective function is the number of substrates d to be grouped, and is expressed by the following equation (1).

[Expression 1]

$$\Sigma G_d \tag{1}$$

(Constraint)

(1) Constraint to be satisfied by component: Components to be mounted on the substrate to be placed in the substrate group must be installed on the carriage.

(2) Channel capacity constraint: The total number of used channels of components installed in the carriage f should not exceed the upper limit number of channels of the carriage f.

The substrate group optimization unit 36 determines the value of each variable by solving an integer programming problem using the integer programming problem solver so that the objective function is maximized.

Next, in step S22, the substrate group optimization unit 36 executes processing of optimizing the feeder arrangement.

In Step S20 described above, since the temporary value of the number of channels used when the feeder of the component p is installed in the carriage f is set as $O_{fp}$, actually, the feeder of the component p cannot necessarily be installed in the carriage f. This is because the number of channels used varies depending on the order in which the components are arranged in the carriage. Accordingly, in step S22, the substrate group optimization unit 36 finds the order in which the used channel is minimized.

In this case, the substrate group optimization unit 36 defines input variables, decision variables, an objective function, and constraints as follows, and formulates the shortest Hamiltonian path problem.

(Input Variable)

(1) $O_{pq}$: The number of channels used when a component q is installed adjacent to the right of the component p.

(2) $Q_p$: The number of channels used when the component p is installed at the left end.

(Decision Variable)

(1) $s_{pq}$: Value 1 is set when the component q is installed adjacent to the right of the component p, and value 0 is set otherwise.

(2) $I_p$: Value 1 is set when the component p is at the left end, and value 0 is set otherwise.

(Objective Function (Minimize))

The objective function is the sum of the number of used channels and is expressed by the following equation (2).

[Expression 2]

$$\Sigma_{(p,q)}(O_{pq} \times s_{pq}) + \Sigma_p(Q_p \times I_p) \quad (2)$$

(Constraint)

(1) One row constraint: Components must be aligned in a row from the left edge to the right edge. Also, all components must be included in the column exactly once.

The substrate group optimization unit 36 determines the value of each variable by solving the shortest Hamiltonian path problem using the integer programming problem solver so that the objective function is minimized.

As described above, after the processing of step S22 is executed, the processing proceeds to step S24, and the substrate group optimization unit 36 determines whether the feeder can be arranged on the carriage. In this case, since the sum of the minimum number of used channels is obtained in step S22 described above, the sum of the minimum number of used channels is compared with the number of channels in the carriage, and if the following equation (3) is satisfied, the substrate group optimization unit 36 determines that the feeder can be arranged on the carriage.

Sum of minimum number of used channels≤number of channels in carriage (3)

If the determination in step S24 is negative, the processing proceeds to step S26, and the substrate group optimization unit 36 reduces the number of channels (upper limit number of channels $M_f$) in the carriage (for example, decrease by 1), and returns to step S20. If the processing returns to step S20, steps S20 to S26 are repeatedly executed until the determination at step S24 is affirmed.

On the other hand, if the determination in step S24 is affirmed, the processing proceeds to step S28. In step S28, the substrate group optimization unit 36 determines a substrate group. The substrate group optimization unit 36 stores the information on the substrate group determined in step S28 in the production plan information DB 56 (substrate group table 156A (FIG. 9A)) through the controller 34. Then, after proceeding to step S30, the substrate group optimization unit 36 determines whether there is any substrate not included in the substrate group determined so far. If the determination in step S30 is affirmed, the processing proceeds to step S32, and after excluding the substrates included in the determined substrate group, the processing returns to step S20. When the processing returns to step S20, the substrate group optimization unit 36 executes processing similar to the processing described above using the remaining substrates.

Then, when all the substrates are included in the substrate group, the determination in step S30 is negative, the entire processing of FIG. 12 (S10) is ended, and the processing proceeds to step S12 of FIG. 11.

(Mounter Component Allocation Optimization Processing (S12))

Next, the processing in step S12 of FIG. 11 (mounter component allocation optimization processing) executed by the component allocation optimization unit 38 will be described along the flowchart of FIG. 13.

Figure 13:
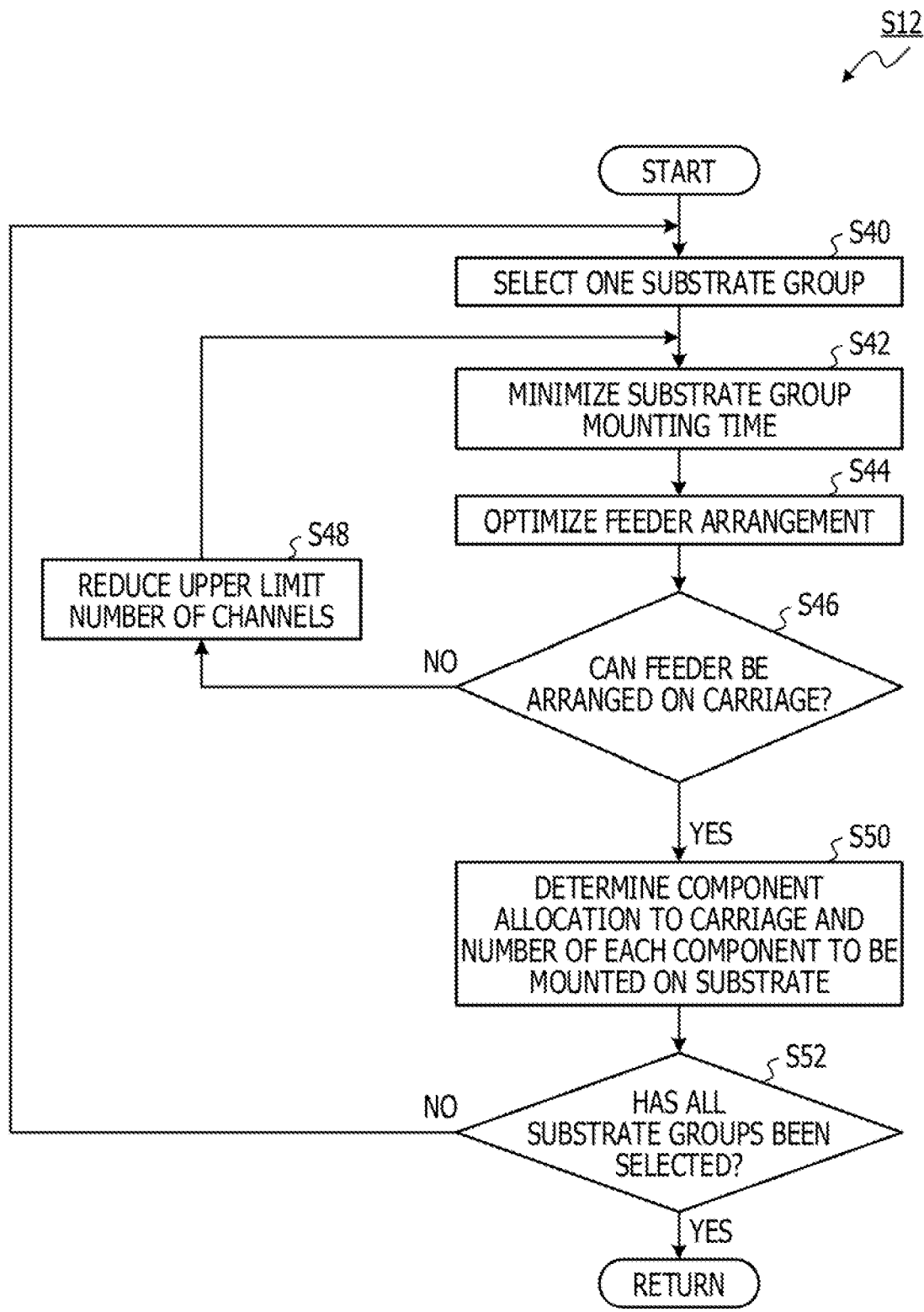
FIG. 13 is a flowchart illustrating details of processing of step S12 in FIG. 11.

In the processing of FIG. 13, first, in step S40, the component allocation optimization unit 38 selects one of the substrate groups determined in step S10.

Next, in step S42, processing for minimizing the substrate group mounting time is executed. In the processing, component allocation to the mounter is optimized so that the total of the mounting times of the selected substrate group is minimized. Specifically, the component allocation optimization unit 38 defines input variables, decision variables, an objective function, and constraints as follows, and formulates an integer programming problem.

Note that if the components p that need to be mounted on the substrate d is assigned to the fixed carriage f, it is assumed that the component p is mounted on the substrate d from the fixed carriage f for the number of components to be mounted, and a decision variable $S_{fdp}$ is preset (before optimization) to a fixed value.

(Input Variable)

(1) $M_f$: The upper limit number of channels of the carriage f.

(2) $TS_{dp}$: The total number of components p mounted on the substrate d.

(3) $C_{fp}$: Machine cycle time when the component p is installed on the carriage f.

(4) $O_{fp}$: The number of channels used when the component p is installed on the carriage f.

(5) $Q_d$: The planned number of substrates d to be manufactured.

The machine cycle time in the above (3) refers to the time required to mount the component p of the carriage f on one substrate. Further, $O_{fp}$ in (4) is a temporary value of the number of channels used when the feeder of the component p is installed on the carriage f, as described above.

(Decision Variable)

(1) $S_{fdp}$: The number of components to be mounted when the component p is mounted from the carriage f to the substrate d.

(2) $RS_{fp}$: Value 1 is set when the feeder of the component p is installed on the carriage f, and value 0 is set otherwise.

(3) $T_{df}$: The mounting time of the substrate d with the carriage f (total machine cycle time).

(4) $MT_d$: The maximum mounting time of the substrate d.

The number of components to be mounted in the above (1) means the number of the components to be mounted on the target substrate (the number of mountings).

(Objective Function (Minimize))

The objective function is expressed by the following equation (4).

[Expression 3]

$$\Sigma_{d \in D} MT_d \times Q_d \quad (4)$$

(Constraint)

(1) Constraint on number of components to be mounted: A specified number of each component must be mounted on each substrate.

(2) Constraint on component installation: A component must be installed on any one of the carriages.

(3) Constraint on mounting time: The maximum mounting time $MT_d$ of the substrate d is equal to the maximum value of the mounting time $T_{df}$ of each mounter of the substrate d, and the mounting time of each mounter is equal to the product of the machine cycle time $C_{fp}$ and the number of components to be mounted $S_p$.

(4) Constraint on installation of tray components: The total number of occupied channels of the components p mounted on the substrate d from a dedicated carriage f for tray components cannot exceed the upper limit number of channels of the carriage f.

(5) Constraint on installation of tape/stick components: The total number of occupied channels of the component group installed on a dedicated carriage f for tape/stick components cannot exceed the upper limit number of channels of the carriage f.

Here, the dedicated carriage for tape/stick components and the dedicated carriage for tray components have different functions and configurations. The tray components can be replaced at when the substrate changes as well, even within one substrate group. On the other hand, the tape/stick components can only be replaced when the substrate group changes. For this reason, the above-mentioned constraint defines that, as for tray parts, it is only necessary that the channels used by the components mounted on the same substrate do not exceed the upper limit number of channels of the carriage.

The component allocation optimization unit 38 determines the value of each variable by solving an integer programming problem using the integer programming problem solver so that the objective function is minimized.

Next, in step S44, the component allocation optimization unit 38 executes processing of optimizing the feeder arrangement. In Step S42 described above, since the temporary value of the number of channels used when the feeder of the component p is installed in the carriage f is set as $O_{fp}$, actually, the feeder of the component p cannot necessarily be installed in the carriage f. This is because the number of channels used varies depending on the order in which the components are arranged in the carriage. Accordingly, in step S44, the component allocation optimization unit 38 finds the order in which the use channel is minimized. Note that since the processing in step S44 is similar to that of step S22 in FIG. 12, descriptions thereof will be omitted.

After the processing of step S44 is executed, the processing proceeds to step S46, and the component allocation optimization unit 38 determines whether the feeder can be arranged on the carriage. In this case, the component allocation optimization unit 38 makes a determination similar to that in step S24 described above.

Then, if the determination in step S46 is negative, the processing proceeds to step S48, and the component allocation optimization unit 38 reduces the number of channels (upper limit number of channels) in the carriage (for example, decrease by 1), and returns to step S42. If the processing returns to step S42, steps S42 to S48 are repeatedly executed until the determination at step S46 is affirmed.

On the other hand, if the determination in step S46 is affirmed, the processing proceeds to step S50. In step S50, the component allocation optimization unit 38 determines the component allocation to the carriage and the number of each component to be mounted on the substrate based on the processing so far. The component allocation optimization unit 38 stores the information determined in step S50 in the production plan information DB 56 (component allocation table 156B (FIG. 9B) through the controller 34.

Thereafter, after proceeding to step S52, the component allocation optimization unit 38 determines whether all substrate groups have been selected in step S40. If the determination in step S52 is negative, the processing returns to step S40. When the processing returns to step S40, one of the unselected substrate groups is selected, and the above-described processing is repeated.

Then, when all the substrate groups are selected and the determination in step S52 is affirmed, the entire processing of FIG. 13 (S12) is ended, and the processing proceeds to step S14 of FIG. 11.

(Manufacturing Order Optimization Processing (S14))

Next, the processing in step S14 of FIG. 11 (manufacturing order optimization processing) executed by the manufacturing order optimization unit will be described along the flowchart of FIG. 14.

Figure 14:
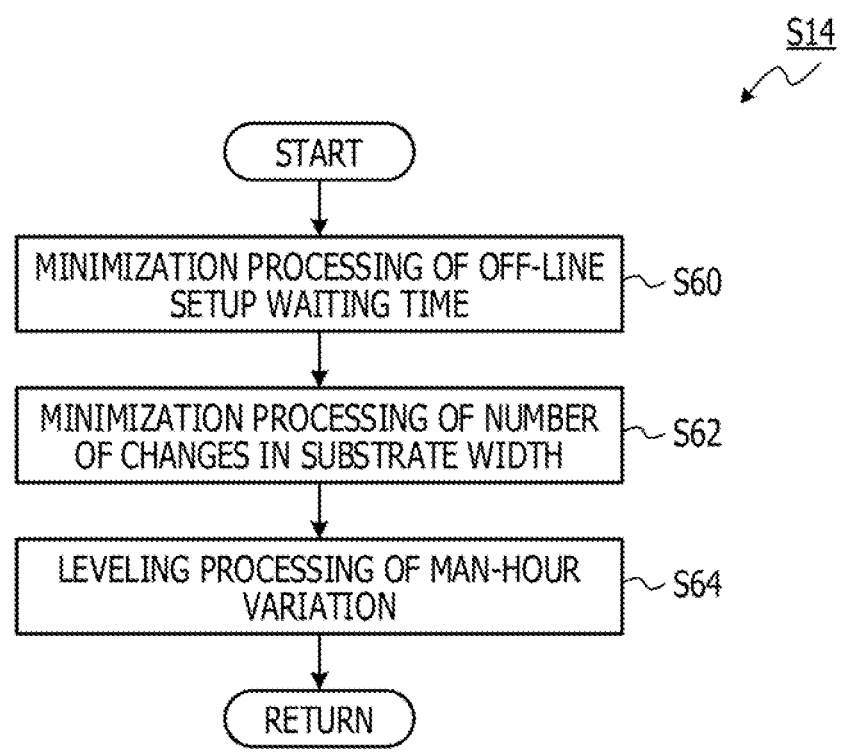
FIG. 14 is a flowchart illustrating details of processing of step S14 in FIG. 11.

In the processing of FIG. 14, processing is executed in the order of minimization processing of off-line setup waiting time (S60), minimization processing of the number of changes in substrate width (S62), and leveling processing of man-hour variation (S64).

(Minimization Processing of Off-Line Setup Waiting Time (S60))

Figure 15A:
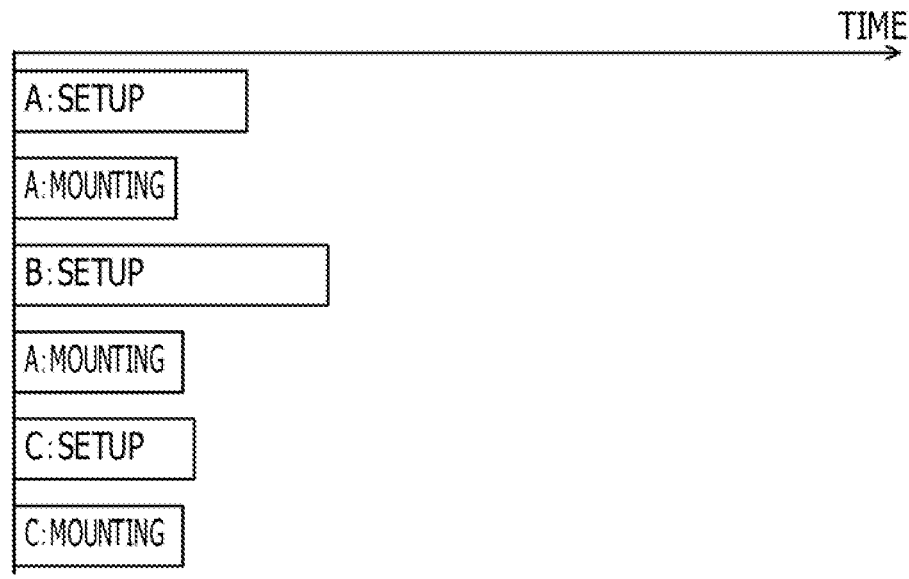
FIGS. 15A and 15B are diagrams for describing minimization processing of off-line setup waiting time.
Figure 15B:
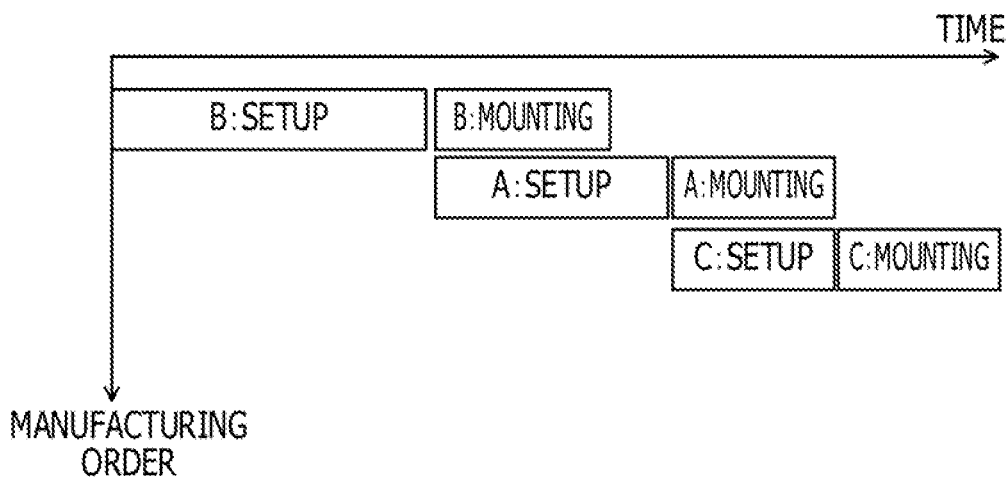

In the minimization processing of off-line setup waiting time (S60), the manufacturing order optimization unit 40 optimizes the manufacturing order of the substrate groups so as to minimize the time from the start of manufacturing to completion of manufacturing (time from start of processing of first substrate group to end of processing of last substrate group). For example, assume that there are substrate groups A to C, and the off-line setup time and mounting time of each group are as illustrated in FIG. 15A. In such a case, the manufacturing order optimization unit 40 rearranges the manufacturing order of the substrate groups so as to minimize the time from the start to completion of manufacturing, and optimizes the manufacturing order as illustrated in FIG. 15B.

Specific processing will be described below. The manufacturing order optimization unit 40 defines input variables, decision variables, an objective function, and constraints as follows, and formulates an integer programming problem.

(Input Variable)

(1) $ST_g$: The off-line setup time of a substrate group g.

(2) $MT_g$: The component mounting time of the substrate group g.

(Decision Variable)

(1) $I_{sg}$: Value 1 is set when the substrate group g is introduced in a manufacturing order s, and value 0 is set otherwise.

(2) $SS_s$: An off-line setup start time in the manufacturing order s.

(3) $SE_s$: An off-line setup end time in the manufacturing order s.

(4) $MS_s$: A component mounting start time in the manufacturing order s.

(5) $ME_s$: A component mounting end time in the manufacturing order s.

(Objective Function (Minimize))

$ME_{|s|}$: A component mounting end time in the final manufacturing order.

(Constraint)

(1) Manufacturing order constraint: In the manufacturing order of substrate groups, all substrate groups must appear once each.

(2) Constraint on start and end times: The off-line setup start time in a manufacturing order s+1 must be after the off-line setup end time in the manufacturing order s. In addition, the component mounting start time in the manufacturing order s must be after the off-line setup end time in the manufacturing order s.

(3) Constraint on off-line setup and mounting time: "Off-line setup end time of manufacturing order s–Off-line setup start time of manufacturing order s" is equal to the off-line setup time of the substrate group of the manufacturing order s. Also, "component mounting end time of manufacturing order s–component mounting start time of manufacturing order s" is equal to the component mounting time of the substrate group of the manufacturing order S.

The manufacturing order optimization unit 40 determines the value of each variable by solving an integer programming problem using the integer programming problem solver so that the objective function is minimized. The manufacturing order optimization unit 40 stores the result (manufacturing order of substrate group) obtained by the processing in the production plan information DB 56 (substrate group manufacturing order table 156D).

Note that the processing order of the substrate groups is determined as illustrated in FIG. 16A by executing the minimization processing of the off-line setup waiting time, and the substrates included in each substrate group, the substrate width of each substrate, and the mounting time of each substrate are determined as illustrated in FIG. 16A. Note that FIG. 16A is an example, and is not consistent with the DB illustrated in FIG. 6 and the like.

(Minimization Processing of Number of Changes in Substrate Width (S62))

Next, the minimization processing of the number of changes in substrate width (S62) will be described. In the processing of step S62, the manufacturing order optimization unit 40 optimizes the manufacturing order of the substrates using the integer programming problem solver so that the number of changes in substrate width is minimized, in order to reduce the load of the work of changing the width of the lane through which the substrate of the mounter flows (manual work by worker). Note, however, that the manufacturing order of the substrate groups determined in step S60 is not changed.

Specific processing will be described below. The manufacturing order optimization unit 40 defines an input variable, a decision variable, an objective function, and constraints as follows, and formulates the shortest Hamiltonian path problem.

(Input Variable)

(1) $W_{de}$: Value 1 is set when there is a difference between the widths of the substrate d and a substrate e, and value 0 is set otherwise.

When a set of substrate-substrate pairs (combination of two substrates) is DD, d and e satisfy the following equation (S).

[Expression 4]

$$\{(d,e)|(d,e) \in DD\} \tag{5}$$

(Decision Variable)

(1) $s_{de}$: Value 1 is set when the substrate d and the substrate e are successively introduced in the order of d and e, and value 0 is set otherwise.

(Objective Function (Minimize))

The objective function is the number of changes in substrate width, and is expressed by the following equation (6).

[Expression 5]

$$\Sigma_{de \in DD} s_{de} \times W_{de} \tag{6}$$

(Constraint)

(1) Substrate group constraint: The manufacturing order of substrates is changed only within the substrate group.

(2) Constraint on substrate order: The substrates must be arranged in order. Also, every substrate in the sequence must appear once each.

The manufacturing order optimization unit 40 determines the value of each variable by solving the shortest Hamiltonian path problem using the integer programming problem solver so that the objective function is minimized.

Note that FIG. 16B illustrates the result of executing the processing of step S62 with respect to FIG. 16A. In the case of FIG. 16A, the substrate width is changed five times (between substrates A and B, between substrates D and E, between substrates E and F, between substrates F and G, and between substrates G and H). However, in the case of FIG. 168, it can be seen that the change in the substrate width is reduced to three times (between substrates C and A, between substrates E and F, and between substrates I and G).

(Leveling Processing of Man-Hour Variation (S64))

Next, the leveling processing of man-hour variation (S64) will be described. In the processing of step S64, the manufacturing order optimization unit 40 optimizes the manufacturing order of substrates so as to level the number of substrates per unit time output to a later process from the surface mounting line 20, in order to level the load (man-hour) of the process after the surface mounting line 20 and improve productivity. However, the manufacturing order of the substrate groups determined in step S60 is not changed, and the change in the substrate width determined in step S62 is not changed.

Specific processing will be described below. The manufacturing order optimization unit 40 defines input variables, decision variables, an objective function, and constraints as follows, and formulates an integer programming problem.

(Input Variable)

(1) $Q_d$: The number of the substrates d (2) $T_d$: The maximum mounting time of the mounting time of the substrate d with each mounter of one substrate (=cycle time of substrate d).

(3) $F_d$: A value obtained by multiplying the cycle time $T_d$ of the substrate d by the number of sheets (total mounting time of substrate d), which is expressed by the following equation (7).

$$F_d = T_d \times Q_d \tag{7}$$

(4) $\mu$: An average cycle time (weighted average according to number of substrates), which is expressed by the following equation (8).

[Expression 6]

$$\mu = \frac{\sum_{d=1}^{|D|} F_d}{\sum_{d=1}^{|D|} Q_d} \quad (8)$$

Note that $F_d$ of the above (3) refers to the "man-hour" in the processing (man-hour variation leveling processing).

(Decision Variable)

(1) Ss: Value 1 is set when the substrate d is introduced in the manufacturing order s, and value 0 is set otherwise.

(2) $DI_s$: An absolute value of a difference between "the ideal number of man-hours to the manufacturing order s" and "(total) man-hours from the first manufacturing order to the manufacturing order s".

(Objective Function (Minimize))

The objective function is the sum of $DI_s$ and is expressed by the following equation (9).

[Expression 7]

$$\Sigma_{s \in D} DI_s \quad (9)$$

(Constraint)

(1) Constraint on change of substrate manufacturing order: The manufacturing order of substrates should be changed only between substrates within the same substrate group and with the same substrate width.

(2) Constraint on substrate order: The substrates must be arranged in order. Also, every substrate in the sequence must appear once each.

(3) $DI_s$ constraint: $DI_s$ must be equal to or greater than the absolute value of the difference between "time when the total number of substrates up to the substrate manufacturing order s is made by the average cycle time per sheet" and "total mounting for each substrate by substrate manufacturing order 1 to s".

The manufacturing order optimization unit 40 determines the value of each variable by solving an integer programming problem using the integer programming problem solver so that the objective function is minimized. The manufacturing order optimization unit 40 updates the arrangement order of the substrates in each group of the substrate group table 156A of the production plan information DB 56, using the result (manufacturing order the substrate groups) obtained by the processing.

Figure 17:
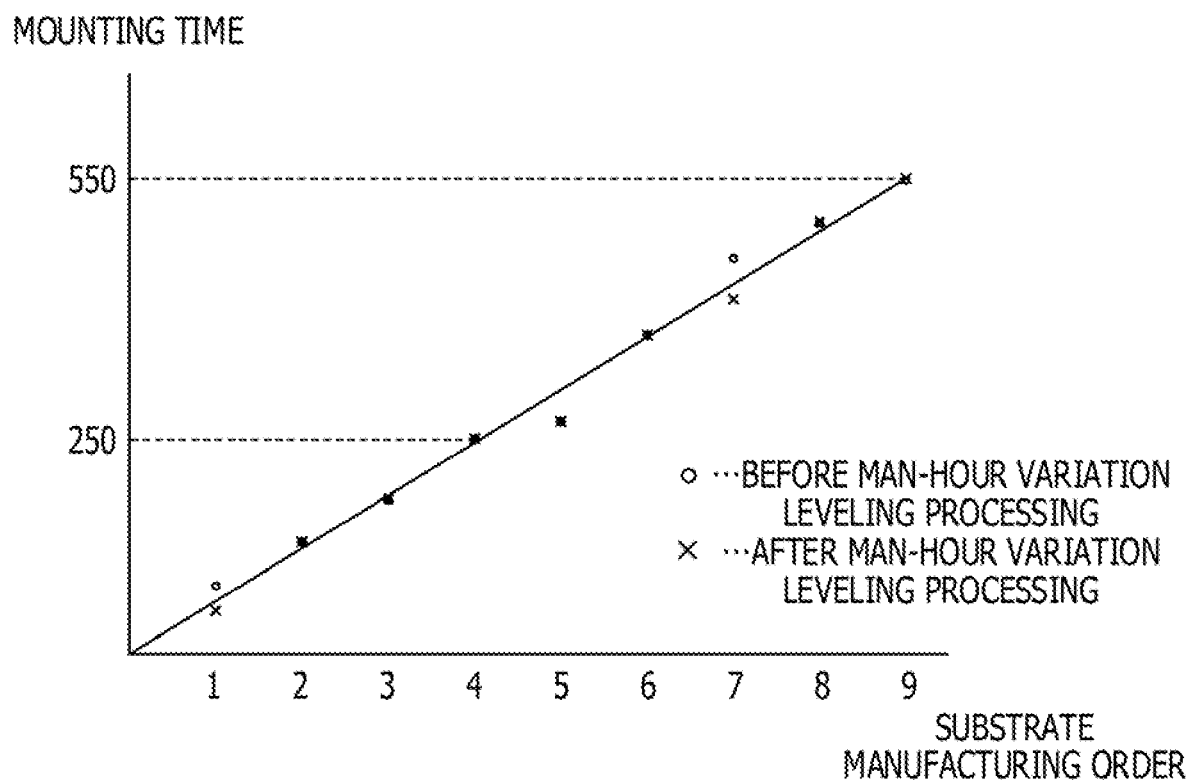
FIG. 17 is a diagram for describing the effect of man-hour variation leveling processing.

Here, FIG. 16C illustrates the result of executing the processing of step S64 with respect to FIG. 16B. Note that in FIG. 16C, as indicated by the double arrows, the manufacturing order of the substrates C and B and the substrates I and H is reversed from that in FIG. 16C. Further, FIG. 17 illustrates mounting times (component mounting times) before and after the man-hour variation leveling processing. Note that the solid line in FIG. 17 indicates an ideal value (ideal number of man-hours). Before the man-hour variation leveling processing (FIG. 16B, ○ in FIG. 17), $DI_s$ was 118, whereas after the man-hour variation leveling processing (FIG. 16C, x in FIG. 17), $DI_s$ becomes 96. Hence, it can be seen that the variation in man-hours is small, and the result is closer to the ideal value.

As described above, when the processing of FIG. 14 ends, the entire processing of FIG. 11 also ends.

Note that the production plan output unit 46 of FIG. 5 transmits the information stored in the production plan information DB 56 to the production line 70 or to the worker terminal 60 under the instruction of the controller 34. By performing production in accordance with the production plan information in the production line 70, it is possible to shorten the production time.

As apparent from the above description, the embodiment implements functions of a processor that includes the substrate group optimization unit 36, the component allocation optimization unit 38, and the manufacturing order optimization unit 40, and optimizes, in stages, multiple factors that affect the production time of a substrate. Further, the function as an acquisition unit that acquires information on the production of a substrate is implemented by the substrate quantity information collector 30 and the production information collector 32.

As described above in detail, according to the embodiment, the substrate quantity information collector 30 and the production information collector 32 acquire the substrate quantity information and the production information, and the substrate group optimization unit 36, the component allocation optimization unit 38, and the manufacturing order optimization unit 40 optimize, in stages, a plurality of elements (substrate group, component allocation, substrate manufacturing order) that affect the time taken to complete production of a substrate, on the basis of the substrate quantity information and the production information. As a result, in the embodiment, an optimization problem of a production plan of the production line 70 is solved by dividing it into optimization problems whose solution is obtained in a realistic time. Hence, combinational explosion can be prevented. Accordingly, it is possible to determine an executable production plan close to an optimal production plan in a realistic time. That is, it is possible to reduce the processing load when a production plan is generated.

Further, according to the present embodiment, since processing is executed in the order of substrate group optimization, component allocation optimization, and substrate manufacturing order optimization, processing duplication and the like can be reduced and efficient processing can be executed.

Further, in the embodiment, in substrate group optimization, a combination of substrates having the largest number of substrates is comprehensively searched by formulating it as an integer programming problem. Hence, a substrate group having a large number of substrates is easily formed, whereby the number of groups can be reduced. By thus reducing the number of substrate groups, it is possible to reduce the off-line setup time.

Further, in the embodiment, also in component allocation optimization and substrate manufacturing order optimization, component allocation and substrate manufacturing order are comprehensively searched by formulating them as integer programming problems. Hence, an appropriate production plan can be generated.

Further, in the embodiment, in substrate group optimization and component allocation optimization, the arrangement of feeders for components stored in the carriage mounted on the mounter is optimized. This can prevent a situation where the feeder cannot be installed on the carriage when the production plan is executed.

Further, in the embodiment, in optimization of the substrate manufacturing order, the minimization processing of the number of changes in substrate width (S62) and the leveling processing of man-hour variation (S64) are executed. As a result, the work load on the operator is reduced by reducing the number of times of the width changing operation of the lane through which the substrate flows. Moreover, it is possible to improve the productivity of the process after the surface mounting line 20 by leveling man-hour variation.

Further, in the embodiment, each optimization processing is formulated as an integer programming problem, and optimization is performed using an integer programming problem solver. Hence, even a large-scale integer programming problems can be solved in a short time.

Note that the above embodiment describes a case where step S60 (minimization processing of off-line setup waiting time), S62 (minimization processing of number of changes in substrate width), and S64 (leveling processing of man-hour variation) are executed in step S14. However, the invention is not limited to this, and a case where only step S60 is executed may be adopted, for example. In addition, other processing may include step S60 and step S62 or step S64.

Figure 18:
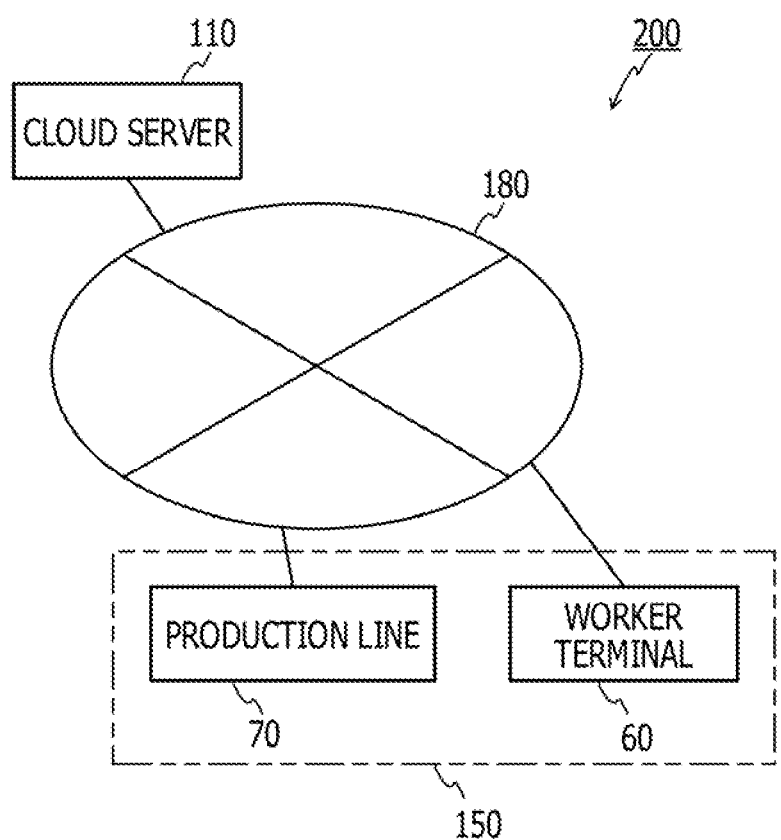
FIG. 18 is a diagram illustrating a modification.

Note that the server 10 may be on-premises managed by a company or the like who owns the production line 70 as in the embodiment (FIG. 1), or may be in the form of a cloud server as in a production system 200 illustrated in FIG. 18. The cloud server 110 in FIG. 18 acquires data transmitted from a worker terminal 60 in a factory 150 through a network 180, processes the data, and provides the processing result to the worker terminal 60. Note that the cloud server 110 and the factory 150 may be located in different countries.

The above processing functions can be implemented by a computer. In that case, a program is provided in which the processing content of a function to be included in a processing apparatus is written. The above processing functions are implemented on a computer by executing the above-mentioned program on the computer. The program in which the processing content is written can be recorded in a computer-readable recording medium (except a carrier wave).

In the case of distributing the program, for example, the program is sold in the form of a portable recording medium such as a digital versatile disc (DVD) or a compact disc read only memory (CD-ROM) in which the program is recorded. Alternatively, it is possible to store the program in a storage device of a server computer and transfer the program from the server computer to another computer through a network.

The computer which executes the program stores, for example, the program recorded in the portable recording medium or the program transferred from the server computer in a storage device of the computer. Then, the computer reads the program from the storage device of the computer and executes processing according to the program. Note that the computer can directly read the program from the portable recording medium and execute processing according to the program. The computer also can sequentially execute processing according to the received program each time when the program is transferred from the server computer.

The embodiments described above are preferred examples of carrying out the present invention. However, the present invention is not limited to these examples, and a variety of modifications can be made without departing from the scope of the present invention.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device comprising:
a memory; and
a processor coupled to the memory and configured to:
acquire information on production of substrates and equipment information on a mounting line in which a component is mounted on the substrates;
optimize, based on the information on the production of the substrates and the equipment information on the mounting line, a plurality of factors that affect a time to complete the production of the substrates, and includes at least grouping of the substrates, component allocation to a mounter which sets the component and a manufacturing order of the substrates; and
execute optimization processing in the order of optimization of the grouping of the substrates, optimization of the component allocation to the mounter which sets the component, and optimization of the manufacturing order of the substrates.

2. The information processing device according to claim 1, wherein in the optimization of the grouping of the substrates and the optimization of the component allocation to the mounter, the processor is configured to optimize arrangement of feeders of the component to a carriage on the mounter.

3. The information processing device according to any one of claim 1, wherein in the optimization of the manufacturing order of the substrates, the processor is configured to minimize a number of changes in a size of substrates which are input to the mounting line or minimize variation in a number of substrates per unit time which are input to the mounting line.

4. The information processing device according to claim 1, wherein in the optimization of the plurality of factors, the processor is configured to formulate an integer programming problem and perform optimization by using an integer programming problem solver.

5. A non-transitory computer-readable recording medium recording a production plan generation program for causing a computer to execute processing of:
acquiring information on production of substrates and equipment information on a mounting line for mounting a component on the substrate, and
optimizing, based on the information on the production of the substrates and the equipment information on the mounting line, a plurality of factors that affect a time to complete the production of the substrates and includes at least grouping of the substrates, component allocation to a mounter which sets the component and a manufacturing order of the substrates,
in the optimization processing, processing is executed in the order of optimization of the grouping of the substrates, optimization of the component allocation to the mounter which sets the component, and optimization of the manufacturing order of the substrates.

6. The non-transitory computer-readable recording medium according to claim 5, wherein in the optimization of the grouping of the substrates and the optimization of the component allocation to the mounter, arrangement of feeders of the components to a carriage mounted on the mounter is optimized.

7. The non-transitory computer-readable recording medium according to claim 5, wherein in the optimization of manufacturing order of the substrates, minimizing a number of changes in a size of substrates which are input to the mounting line or minimizing variation in a number of substrates per unit time which is input to the mounting line.

8. The non-transitory computer-readable recording medium according to claim 5, wherein in the optimization of the plurality of factors, an integer programming problem is formulated, and optimization is performed by using an integer programming problem solver.

9. A production plan generation method comprising:
acquiring, by a computer, information on production of substrates and equipment information on a mounting line in which a component is mounted on the substrates, and
optimizing, based on the information on the production of the substrates and the equipment information on the mounting line, a plurality of factors that affect a time to complete the production of the substrates and includes at least grouping of the substrates, component allocation to a mounter which sets the component and a manufacturing order of the substrates,
in the optimization processing, processing is executed in the order of optimization of the grouping of the substrates, optimization of the component allocation to the mounter which sets the component, and optimization of the manufacturing order of the substrates.

10. The production plan generation method according to claim 9, wherein in the optimization of the grouping of the substrates and the optimization of the component allocation to the mounter, arrangement of feeders of the components to a carriage mounted on the mounter is optimized.

11. The production plan generation method according to claim 9, wherein in the optimization of manufacturing order of the substrates, minimizing a number of changes in a size of substrates which are input to the mounting line or minimizing variation in a number of substrates per unit time which is input to the mounting line.

12. The production plan generation method according to claim 9, wherein in the optimization of the plurality of factors, an integer programming problem is formulated, and optimization is performed by using an integer programming problem solver.

* * * * *